(12) United States Patent
Nallani et al.

(10) Patent No.: US 9,787,272 B2
(45) Date of Patent: Oct. 10, 2017

(54) LINEARIZING AND REDUCING PEAKING SIMULTANEOUSLY IN SINGLE-TO-DIFFERENTIAL WIDEBAND RADIO FREQUENCY VARIABLE GAIN TRANS-IMPEDANCE AMPLIFIER (TIA) FOR OPTICAL COMMUNICATION

(71) Applicant: Avago Technologies General IP (Singapore) Pte. Ltd., Singapore (SG)

(72) Inventors: Chakravartula Nallani, San Jose, CA (US); Rahul Shringarpure, San Jose, CA (US); Georgios Asmanis, Lake Forest, CA (US); Faouzi Chaahoub, San Jose, CA (US); Kishan Venkataramu, Santa Clara, CA (US)

(73) Assignee: AVAGO TECHNOLOGIES GENERAL IP (SINGAPORE) PTE. LTD., Singapore (SG)

( * ) Notice: Subject to any disclaimer, the term of this patent is extended or adjusted under 35 U.S.C. 154(b) by 166 days.

(21) Appl. No.: 14/927,885

(22) Filed: Oct. 30, 2015

(65) Prior Publication Data

US 2017/0126191 A1  May 4, 2017

(51) Int. Cl.
| | |
|---|---|
| *H03F 3/08* | (2006.01) |
| *H03G 3/30* | (2006.01) |
| *H01L 31/02* | (2006.01) |
| *H04B 10/40* | (2013.01) |
| *H03G 5/28* | (2006.01) |

(52) U.S. Cl.
CPC ..... *H03G 3/3084* (2013.01); *H01L 31/02016* (2013.01); *H03F 3/08* (2013.01); *H03G 5/28* (2013.01); *H04B 10/40* (2013.01); *H03F 2200/294* (2013.01); *H03F 2200/339* (2013.01)

(58) Field of Classification Search
CPC ......... H03F 3/005; H03F 3/08; H03G 3/3078; H03G 3/3084
USPC .......................................... 250/214 R, 214 A
See application file for complete search history.

(56) References Cited

U.S. PATENT DOCUMENTS

| | | |
|---|---|---|
| 3,191,124 A | 6/1965 | Brown |
| 4,342,048 A * | 7/1982 | Falater ...................... H04N 5/68 348/379 |
| 5,751,190 A | 5/1998 | Nguyen et al. |
| 2006/0097789 A1 | 5/2006 | Irie |

* cited by examiner

*Primary Examiner* — Que T Le
(74) *Attorney, Agent, or Firm* — Sheridan Ross P.C.

(57) ABSTRACT

An amplifier, a circuit, and an optical communication system are provided. The disclosed amplifier may include a first transistor receiving a first portion of an input signal received at the amplifier, a second transistor receiving a second portion of the input signal, an automatic gain control signal that is dynamically adjustable in response to variations in an output of the amplifier, and a varactor that has its capacitance adjusted by changes in the automatic gain control signal and, as a result, adjusts a position of a pole in a transfer function of the amplifier.

20 Claims, 11 Drawing Sheets

LINEARIZING AND REDUCING PEAKING SIMULTANEOUSLY IN SINGLE-TO-DIFFERENTIAL WIDEBAND RADIO FREQUENCY VARIABLE GAIN TRANS-IMPEDANCE AMPLIFIER (TIA) FOR OPTICAL COMMUNICATION

FIELD OF THE DISCLOSURE

The present disclosure is generally directed toward amplifiers and their use in various types of systems such as optical communication systems.

BACKGROUND

To save power and increase data handling capacity per channel, optical data transmission systems have multiple single-ended receiver channels. Typically, the optical receiver channel has a wide-bandwidth linear single-to-differential radio frequency (RF) variable gain amplifier at its Analog Front-End (AFE). The AFE converts photodiode (e.g., PIN current) to voltage. There are two things of interest with respect to traditional AFEs: (1) high bandwidth and pass-band flatness and (2) linearity.

Regarding the high bandwidth and pass-band flatness, unlike conventional Low Noise Amplifiers (LNA), which are terminated with a 50 ohm transmission line at the input, the TIA has a large photodiode capacitance at its input. Hence, the input PIN diode capacitance sets the TIA bandwidth and contributes to the dominant-pole of the amplifier. Modern optical communication systems transmit data at 400 Gbps or higher and have multiple receiver channels receiving 28 Gbps per channel. This means that the TIA used in the optical receiver channel requires more than 20 GHz to 25 GHz of bandwidth. Large photodiode capacitance reduces the TIA bandwidth and, therefore, reduces the optical receiver data rate. Also, any peaking in the frequency response will lead to overshoots in the transient waveform leading to eye closure.

Non-linearity is also of importance because it leads to in-band distortion components. Moreover, modern optical data transmission system using complex modulation schemes (e.g., PAM-4) require lower non-linearity (DNL), which is the performance metric used to quantify the distortion in a Data Eye-Diagram. Higher DNL creates a distorted Data Eye, which results in bit errors that are not acceptable in secured communication links.

BRIEF DESCRIPTION OF THE DRAWINGS

The present disclosure is described in conjunction with the appended figures, which are not necessarily drawn to scale.

DETAILED DESCRIPTION

The ensuing description provides embodiments only, and is not intended to limit the scope, applicability, or configuration of the claims. Rather, the ensuing description will provide those skilled in the art with an enabling description for implementing the described embodiments. It being understood that various changes may be made in the function and arrangement of elements without departing from the spirit and scope of the appended claims.

Various aspects of the present disclosure will be described herein with reference to drawings that are schematic illustrations of idealized configurations. As such, variations from the shapes of the illustrations as a result, for example, circuit configurations, manufacturing techniques and/or tolerances, are to be expected. Thus, the various aspects of the present disclosure presented throughout this document should not be construed as limited to the particular circuit elements illustrated and described herein but are to include deviations in circuits and functionally-equivalent circuit components.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this disclosure.

Figure 1:
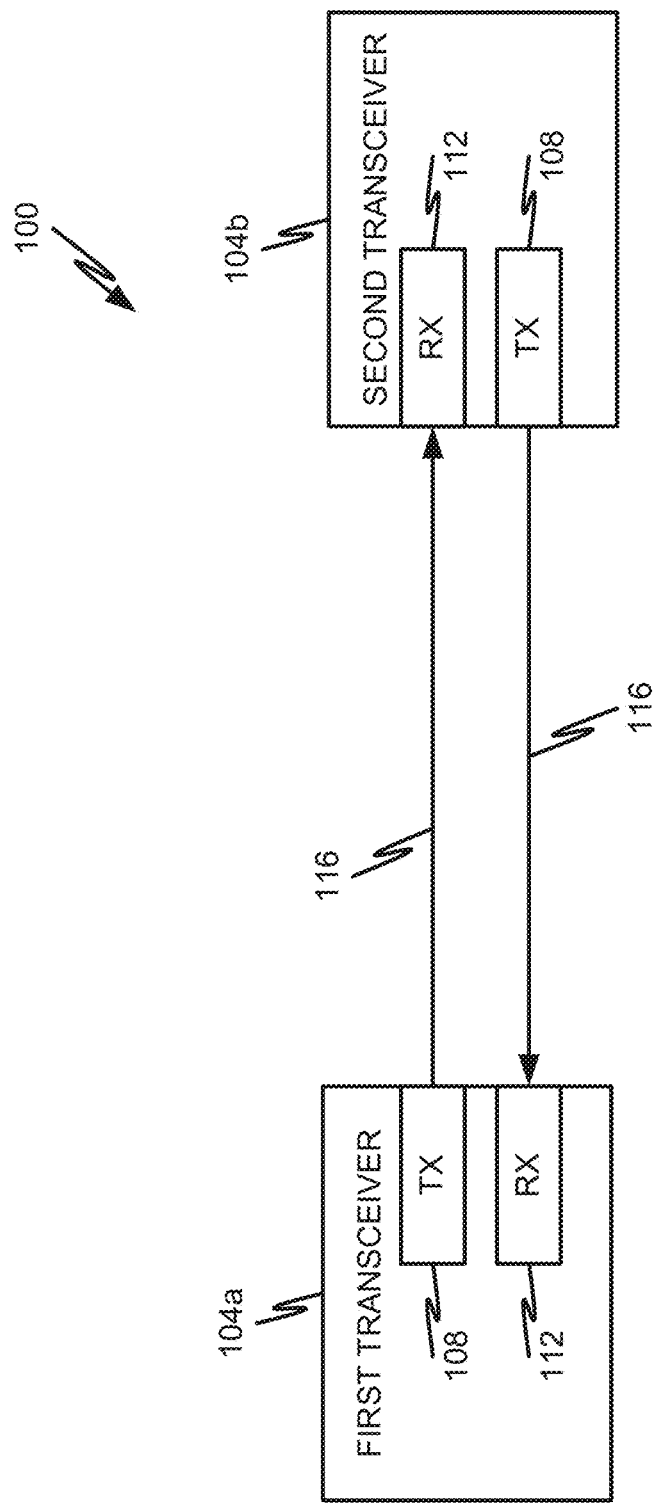
FIG. 1 is a block diagram depicting an optical communication system in accordance with at least some embodiments of the present disclosure.
Figure 2:
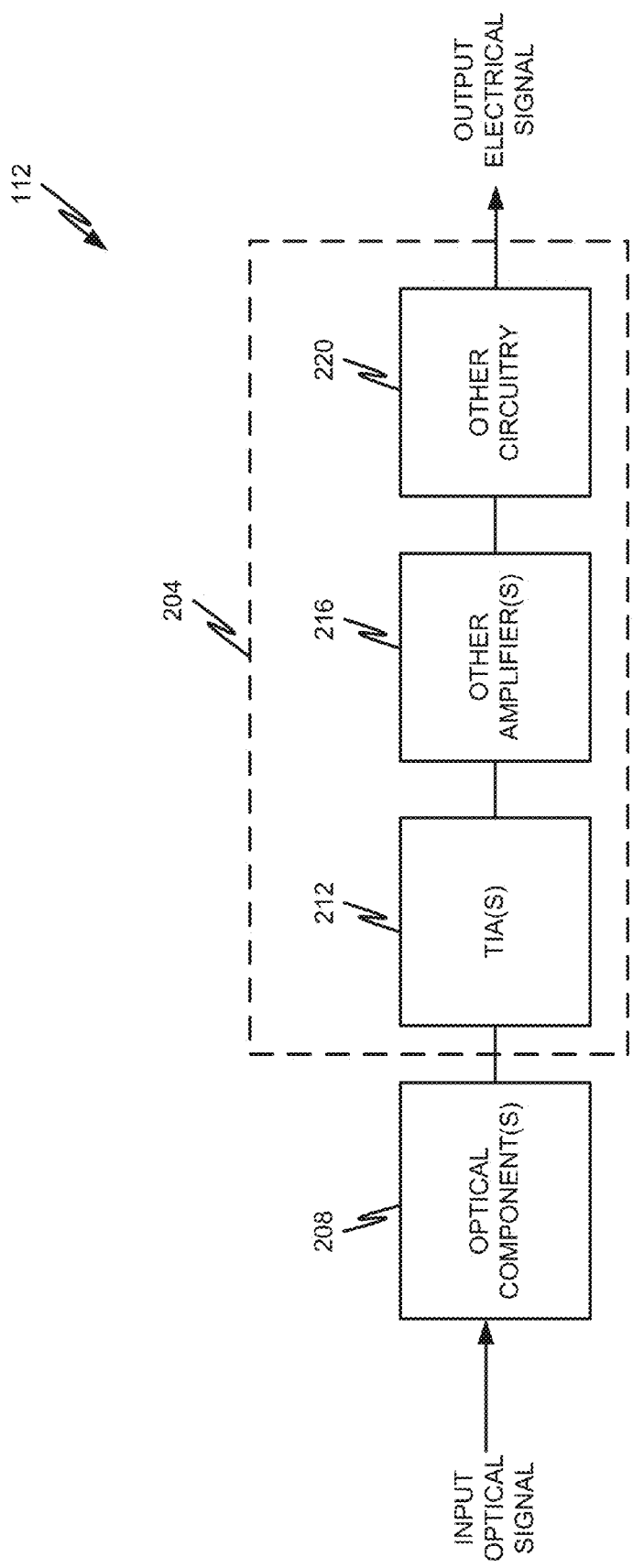
FIG. 2 is a block diagram depicting an optical receiver in accordance with at least some embodiments of the present disclosure.

With reference now to FIGS. 1 and 2, an illustrative communication system 100 in which embodiments of the present disclosure may be utilized will be described. The system 100 is shown to include one or more transceivers 104a, 104b, each having a transmitter 108 and a receiver 112. The transceivers 104a, 104b are shown to communicate with one another via one or more communication channels 116 that connect a transmitter 108 with a receiver 112. It should be appreciated that embodiments of the present disclosure may also be implemented in a communication system having dedicated transmitters 108 and receivers 112 instead of a combination of a transmitter 108 and receiver 112 being implemented in a transceiver 104.

In a specific, but non-limiting example of the communication system, signals carried between the transmitter 108 and receiver 112 are transmitted at a relatively high bit rate (e.g., 10 Gbps, 25 Gbps, or greater) using a modulation technique that doubles the achievable data rate for a given link bandwidth. More specific types of modulation techniques that may be used in the communication system 100 include, without limitation, a Pulse Amplitude Modulation (PAM)-4 modulation scheme (or a QAM-16 or QAM-64 modulation scheme).

The receiver 112, as further depicted in FIG. 2, is configured to receive an input optical signal and produce an output electrical signal using the combined functionality of the optical component(s) 208 and AFE 204. Although certain components are depicted as being included in the AFE 204, it should be appreciated that embodiments of the present disclosure are not limited to the depicted configuration of components.

Although embodiments of the present disclosure will be described in connection with circuitry for an optical communication system having a variable gain amplifier, it should be appreciated that embodiments of the present disclosure are not so limited. To the contrary, any circuit element exhibiting a behavior that can benefit from some type of distortion-improvement scheme disclosed herein could utilize embodiments of the present disclosure. Furthermore, embodiments of the present disclosure are not limited to communication systems or optoelectronic components of communication systems. Instead, embodiments of the present disclosure can be used in a wide variety of environments including computing applications, server applications, data centers, etc.

Figure 3:
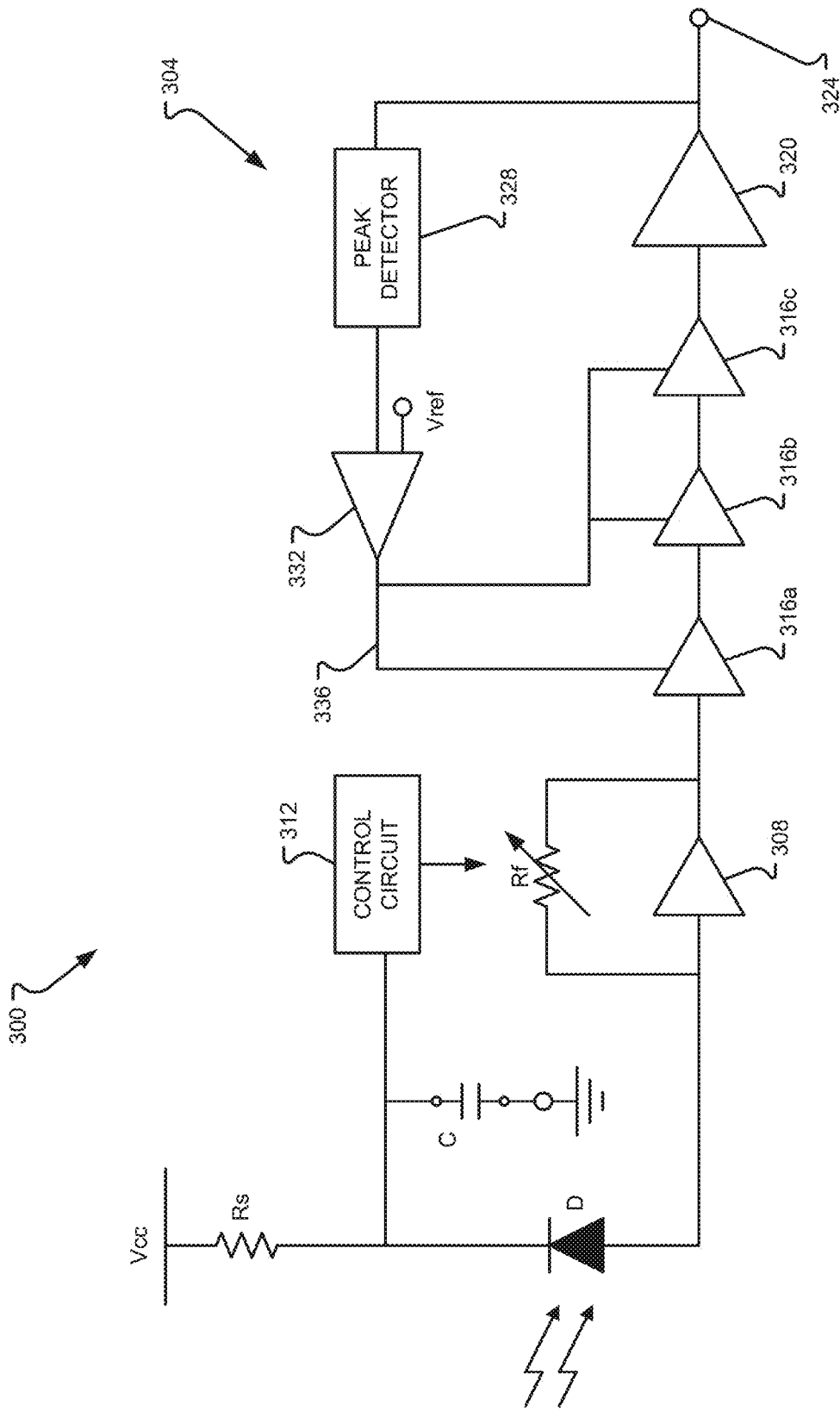
FIG. 3 is a circuit diagram depicting an illustrative receiver circuit in accordance with at least some embodiments of the present disclosure.

As will be discussed in further detail herein, an approach is presented herein in which the TIA's 212 bandwidth and linearity are greatly improved. With reference now to FIG. 3, additional details of a circuit 300 which may be included as part of the AFE 204 will be described in accordance with at least some embodiments of the present disclosure. The circuit 300 is shown to include a photodiode D, a first amplifier 308, a plurality of second amplifiers 316a-c, an output driver 320, a gain control loop 304, an amplifier control circuit 312, and a circuit output 324. In this figure we have to add the VGA as one of the amplifier with the control circuits.

The photodiode D may correspond to one example of an optical component 208. The photodiode D may be biased by input voltage Vcc connected to the photodiode D through a supply resistor Rs.

The first amplifier 308 may correspond to an example of the TIA 212. In addition to including the amplifier itself, the TIA 212 may also include a feedback resistor Rf connected between an input and an output of the first amplifier 308. The feedback resistor Rf may include a static resistance or a controllable feedback network that is controlled by control circuit 312. In some embodiments, the control circuit 312 may comprise one or more control elements that adjust the feedback resistor Rf or other values of feedback components in the feedback loop of the first amplifier 308.

The output of the first amplifier 308 is provided to the series of second amplifiers 316a, 316b, 316c, which may correspond to examples of other amplifiers 216. In some embodiments, the amplifiers 316a-c comprise variable gain amplifiers that are each controlled with a gain control voltage 336 output by an integrator 332 and peak detector 328 in the gain control loop 304. Specifically, the variable gain amplifiers 316a-c may have their control voltage adjusted as the output signal 324 changes over time. The change in the control voltage 336 may be implemented by the peak detector 328 detecting peaks and/or valleys in the output signal 324 and then provided information about such detected peaks and valleys to the integrator 332. The integrator 332 may integrate the output of the peak detector 328 with a reference voltage Vref, which may correspond to a predetermined reference or threshold voltage. In other words, if the peak detector 328 detects peaks of the output signal 324 to exceed the reference voltage Vref, then the integrator 332 may adjust the control voltage 336, thereby altering the amount of gain applied by the variable gain amplifiers 316a-c.

Although FIG. 3 shows a series of three variable gain amplifiers, it should be appreciated that a greater or lesser number of variable gain amplifiers 316a-c can be incorporated into the circuit 300 without departing from the scope of the present disclosure. Furthermore, the configuration of variable gain amplifiers 316a-c may be the same or they may be different from one another without departing from the scope of the present disclosure.

The output driver 320 may correspond to an example of other circuitry 220. In some embodiments, the output driver 320 receives the output from the plurality of variable gain amplifiers 316a-c and produces the output signal 324. The output driver 320 may include a 50 ohm output driver having two pairs of differential transistors connected to one another in a known fashion.

While there are current solutions to handle the TIA bandwidth and linearity, conventional techniques do not address the peaking that arises in the transfer function of the TIA 212. As one example, a reducing feedback resistor Rf has been conventionally used. In this solution, as input optical power increases, the feedback resistor Rf is scaled down so that the voltage swing coming out of the first stage 308 (e.g., current-to-voltage converter) is reduced. Consequently, the stages 316a-c and 320 following the first stage 308 can operate in the linear region. Although reducing the feedback resistor Rf in a resistive feedback type TIA 212 pushes the dominant R-C pole and enhances the TIA 212 bandwidth, this also increases the peaking coming out of the first stage 308.

Another approach is to increase the degeneration resistance value in the gain stages 308, 316a-c, 320. By increasing this degeneration resistance value in the voltage gain stages as the optical input power increases, the gain stage is able to behave more linearly. However, this also causes the location of the pole introduced by the degeneration to decrease in value and cause the transfer function to have more peaking. As will be discussed in further detail herein, an improved variable gain amplifier circuit is disclosed in which one or more varactors can be added to the output of the differential pair in a variable gain amplifier circuit. The varactor(s) can be controlled by the Automatic Gain Control (AGC) loop control voltage. As the optical input power changes (e.g., from −11 dBm to 5 dBm), the AGC voltage varies (e.g., from roughly 2.5V to 1.4V) and changes the value of the capacitance added by the varactor(s). Before further discussing the details of this approach, it is useful to understand an example of a variable gain amplifier circuit without one or more varactors as disclosed herein.

Figure 4:
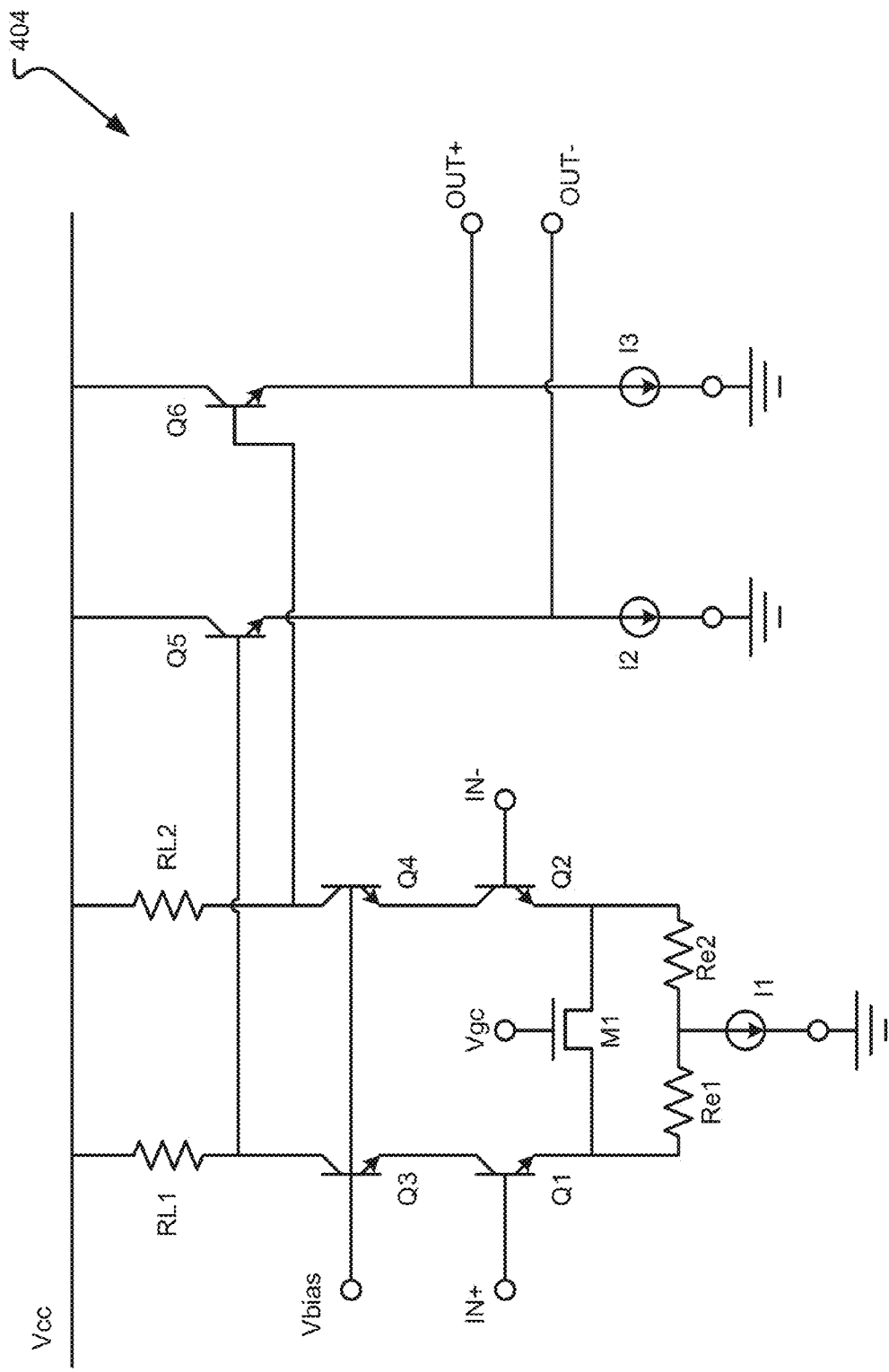
FIG. 4 is a circuit diagram depicting details of variable gain amplifier circuit in accordance with at least some embodiments of the present disclosure.

With reference now to FIG. 4, additional details of a variable gain amplifier circuit 404 conventionally used in as an example of other amplifier(s) 216 will be described in accordance with at least some embodiments of the present disclosure. The variable gain amplifier circuit 404 may correspond to an example of the circuitry for any one of the variable gain amplifiers 316a-c. In some embodiments, each variable gain amplifier 316a-c may have the same circuit 404 configuration. In other embodiments, each variable gain amplifier may have slightly different circuitry or a configuration of circuit components.

The illustrative circuit 404 for a variable gain amplifier 316 is shown to include a first pair of differential transistors Q1, Q2 connected in series with a second pair of differential transistors Q3, Q4. The first pair of differential transistors Q1, Q2 may receive opposite input signals IN+, IN−, at their respective bases whereas the second pair of differential transistors Q3, Q4 may by controlled by a bias voltage Vbias at their bases. The collectors of the transistors Q3, Q4 is connected to the supply voltage VCC through load resistors RL1, RL2, respectively. The emitters of the transistors Q3, Q4 may be directly connected to the collectors of the transistors Q1, Q2. The emitters of the transistors Q1, Q2 may be connected to one another with a transistor M1 being controlled by the gain control voltage 336 or Vgc. The emitters of transistors Q1, Q2 are also provided as an output current I1 through resistors Re1, Re2, respectively.

In collectors of the transistors Q3, Q4 are further connected to bases of another pair of differential transistors Q5, Q6, whose collectors are connected directly to the control voltage Vcc. The emitters of the transistors Q5, Q6 are provided as a differential output OUT+, OUT−, respectively, in addition to driving output currents I2 and I3.

Figure 5:
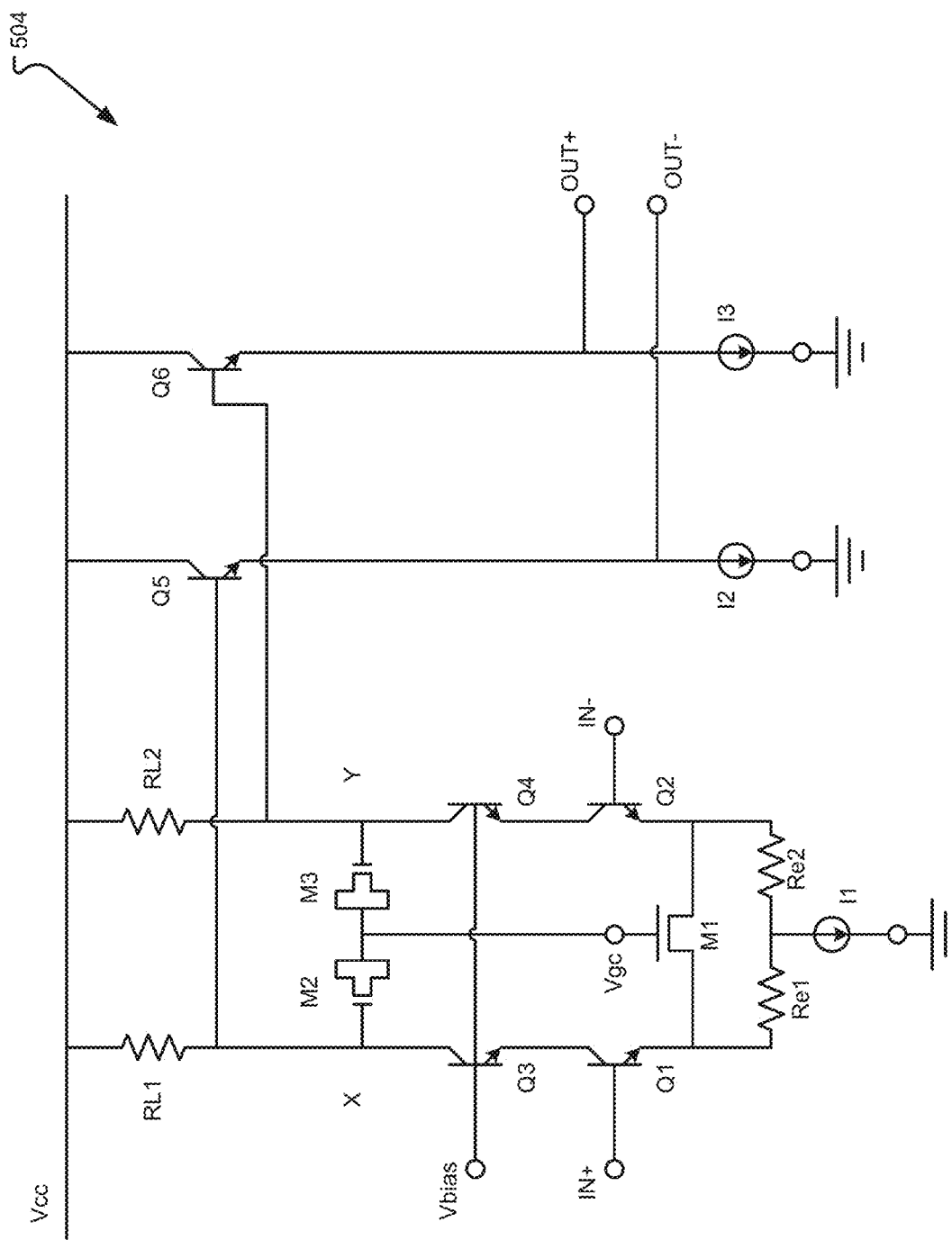
FIG. 5 is a circuit diagram further depicting details of a variable gain amplifier circuit in accordance with at least some embodiments of the present disclosure.

FIG. 5 depicts a circuit 504 for a variable gain amplifier 316 having one or more varactors M2, M3 included therein. As with circuit 404, this circuit 504 or its various components may be included in any stage of the circuit 304. For example, the circuit 504 may be incorporated into one of the variable gain amplifiers 316a-c, two or more of the variable gain amplifiers 316a-c, or all of the variable gain amplifiers 316a-c. It may also be possible to include aspects of circuit 504 into the TIA 308 or output driver 320 without departing from the scope of the present disclosure.

Normally, if reducing the peaking in the transfer function of the variable gain amplifier 316 is desired, a pole is added to cancel out the effects of a zero. Adding a pole in the transfer function of the variable gain amplifier 316 essentially means adding a capacitor someplace in the amplifier across a resistor. The fact that the optical input power to the TIA 308 can vary from −11 dBm to about 5 dBm should also be considered. Accordingly, the transfer function of the entire amplifier chain (e.g., the transfer function at the output 324) changes as the optical power changes as described herein above. If addition of a pole to the transfer function is desired to reduce the peaking, it may be useful to ensure that the location of the pole changes with the received input optical power. Hence, the introduction of the varactor(s) M2, M3 are proposed herein. In particular, as seen in the circuit 504, a varactor M2, M3 is added to the output of the differential pair in the variable gain amplifier 316. The value of the varactor M2, M3 is controlled by the Automatic Gain Control (AGC) loop control voltage Vgc.

Figure 6A:
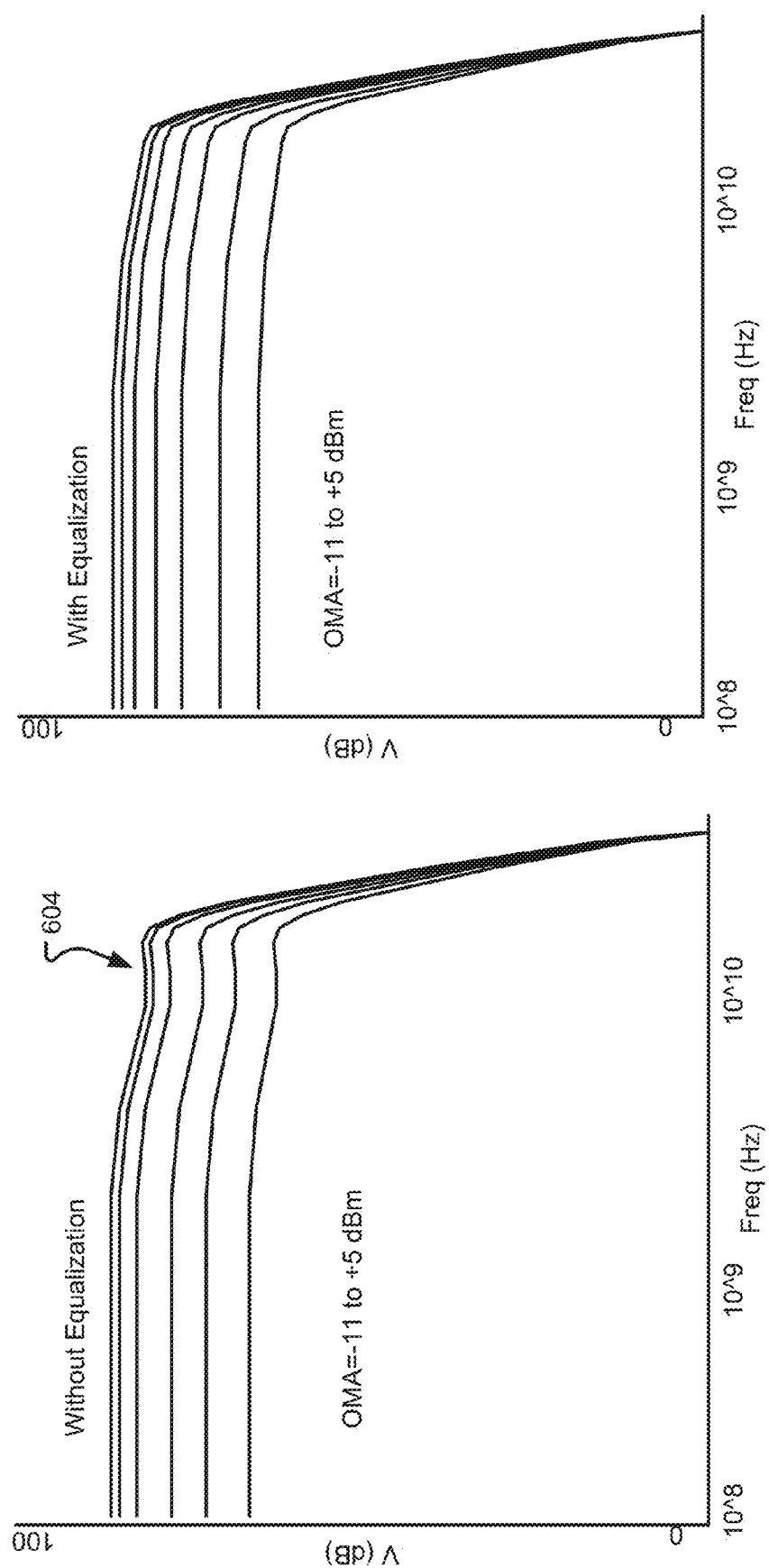
FIG. 6A is a plot of maximum DNL measured at an output of a variable gain amplifier as a function of optical modulation amplitude with and without equalization in accordance with at least some embodiments of the present disclosure.

Behavior of the circuit 504 is as follows. At low optical power inputs, the AGC control voltage is at a high value (e.g., close to 2.5V). This means that the degeneration resistance value is also at a lowest possible value which means the gain is high. The location of the zero that is added because of this is pushed up and so the peaking is reduced. Also, the TIA feedback resistor Rf is at a high value leading to high gain and low peaking from that stage 308. Under this condition, there isn't any substantial peaking 604, which means that peaking 604 does not particularly need to be addressed. Because the AGC control voltage Vgc is at a high value, the capacitance of the varactor M2, M3 is at a low value. Therefore the effect on the overall transfer function is very small which is desirable as shown in FIG. 6A.

Figure 6B:
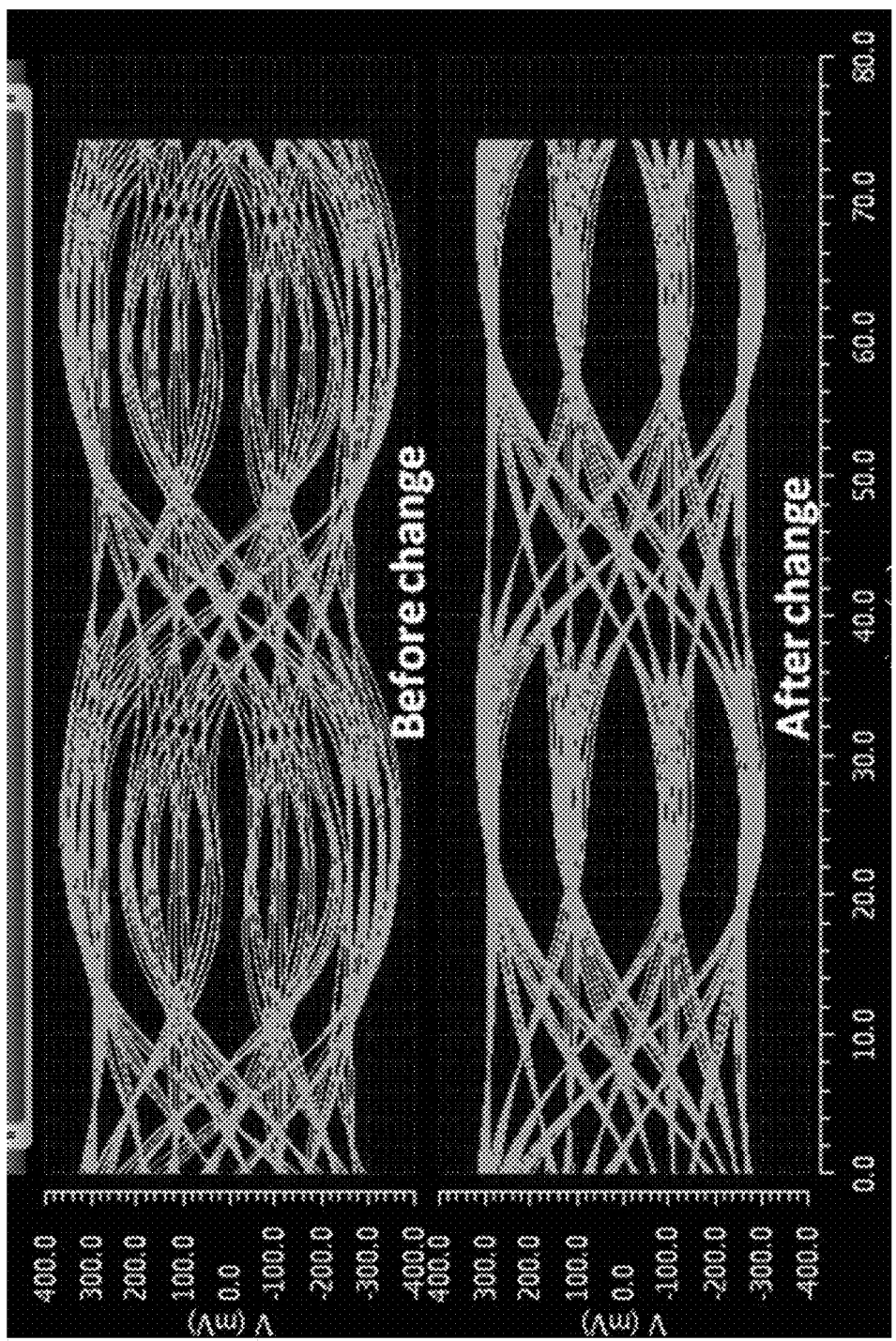
FIG. 6B is a data eye diagram depicting illustrative PAM-4 signaling before and after equalization in accordance with at least some embodiments of the present disclosure.
Figure 7:
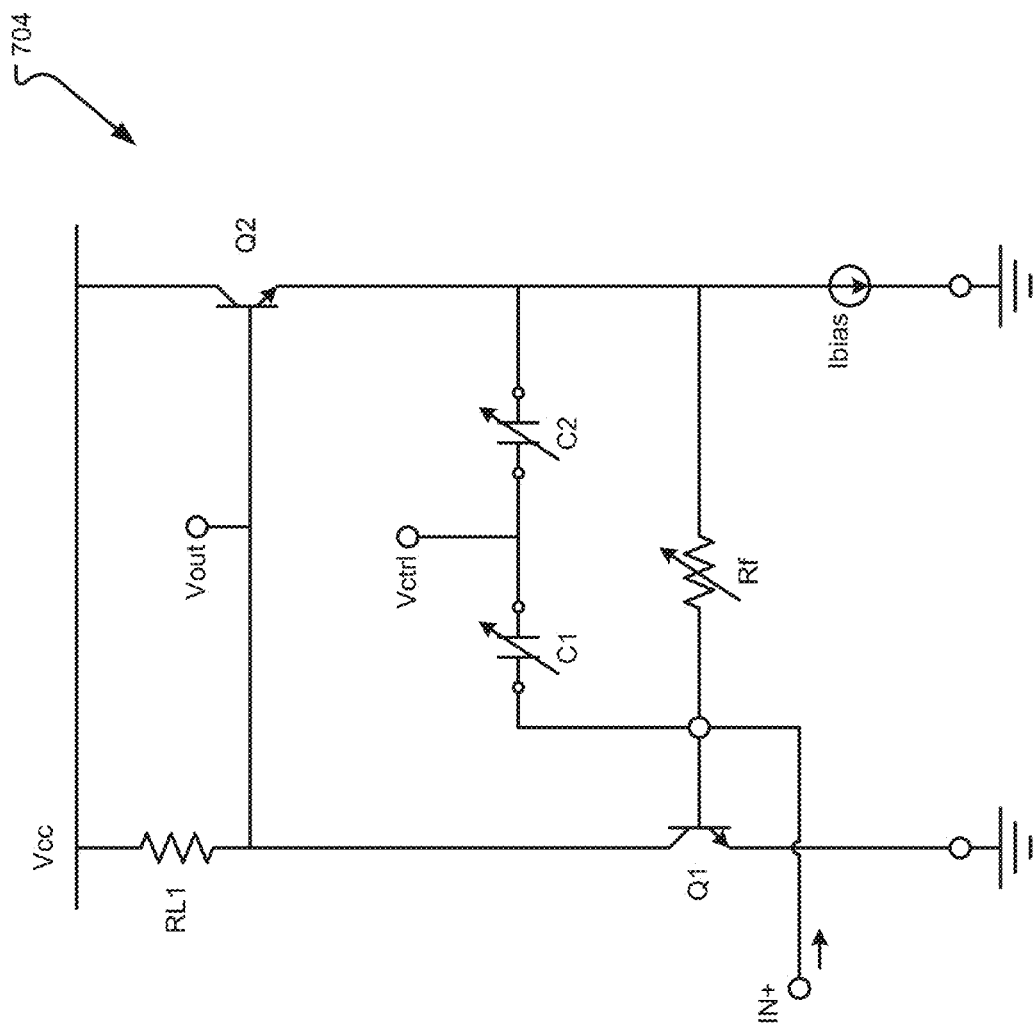
FIG. 7 is a circuit diagram depicting an alternative variable gain amplifier circuit in accordance with at least some embodiments of the present disclosure.

At high optical power inputs, the AGC control voltage Vgc is at a low value (e.g., close to 1.5V). This means that the degeneration resistance value is at a high value, which means the gain is low. The location of the zero added by the M1, Re1, Re2 combination is pushed down and the so the peaking is increased. Also, the TIA feedback resistor Rf decreases in value as compared to the earlier case, leading to high peaking 604 as shown in FIG. 6A. Under this condition, the peaking should be addressed, otherwise there will be a significant amount of eye closure as shown in FIG. 6B. Because the AGC control voltage Vgc is at a low value, the varactor M2, M3 capacitance is at a high value. Therefore, the effect on the overall transfer function is that the peaking 604 is reduced (see FIG. 6A) and the quality of the eye diagram is improved (see FIG. 6B).

In some embodiments, the disclosed approach scales well with temperature. As temperature increases, the AGC control voltage Vgc increases leading to lower capacitance value from the varactor M2, M3, which means that transfer function is affected to a lesser extent and bandwidth doesn't degrade much. This is generally desirable at higher temperatures where bandwidth tends to be lower. Conversely, as temperature decreases, the AGC control voltage Vgc decreases leading to a higher capacitance value from M2, M3 so that transfer function is impacted to a greater extent and any peaking 604 which arises because of low temperature effects is reduced.

The varactors M2, M3 form the variable capacitors at nodes X and Y shown in FIG. 5. As discussed above, the capacitance of the varactors M2, M3 are impacted by the adjustable AGC control voltage Vgc that is input to the transistor M1. In other words, the varactors M2, M3 has its capacitance adjusted by changes in the automatic gain control signal Vgc and, as a result, adjusts a position of the pole in the transfer function of the amplifier 316.

With reference now to FIGS. 7-10 circuits 704, 804, 904, 1004 will be described that can be used in addition to any one of the various circuits already depicted and described herein or as an alternative to any of the circuits depicted and described herein. The circuits 704, 804, 904, 1004 can be used to address the peaking problems and non-linearity problems described herein.

In a first example, a circuit 704 may be utilized in which varactors C1, C2 are added in parallel with the feedback resistor Rf in the TIA stage 308. The control voltage for these varactors Vctrl can scale with the input optical power similar to the varactors M2, M3. The circuit 704, however, receives a supply voltage of the TIA 212 as opposed to the supply voltage of the variable gain amplifier. While these supply voltages can be the same, they do not necessarily need to be the same. For instance, the supply voltage to circuit 704 (and the other circuits 804, 904, 1004) may correspond to a first supply voltage whereas the circuit 504 may receive a second supply voltage that is different from the first supply voltage. When the input optical power is low, the control voltage Vcc for circuit 704 is high, which leads to a higher capacitance in the varactors C1, C2 and more impact on the transfer function, which ultimately results in lower peaking. This particular solution results in some reduction of the peaking 604 but is not quite sufficient by itself and may, therefore, be combined with other methods.

Figure 8:
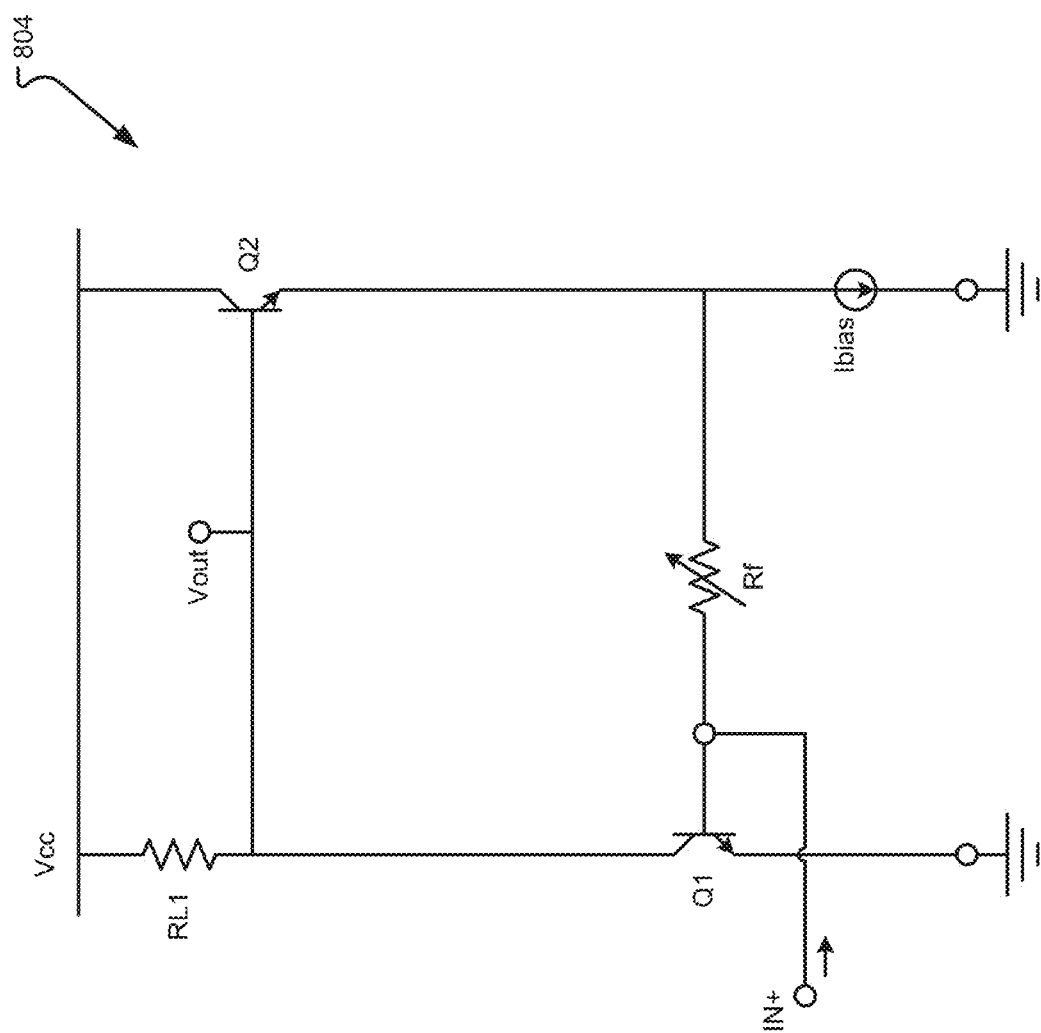
FIG. 8 is a circuit diagram depicting yet another alternative variable gain amplifier circuit in accordance with at least some embodiments of the present disclosure.

The next circuit 804 depicted in FIG. 8 shows a simplified version of the circuit 704. Here, the supply voltage Vcc of the circuit 804 is reduced for the TIA stage 308 based on the input optical power. This particular solution results in some reduction of the peaking 604 without requiring as many circuit components as circuit 704, but is not quite as effective as circuit 704 in totally reducing the peaking. Accordingly, it may be desirable to utilize circuit 804 in combination with circuit 504 (or any other circuit disclosed herein) to minimize the peaking 604 and improve the overall quality of the data eye.

Figure 9:
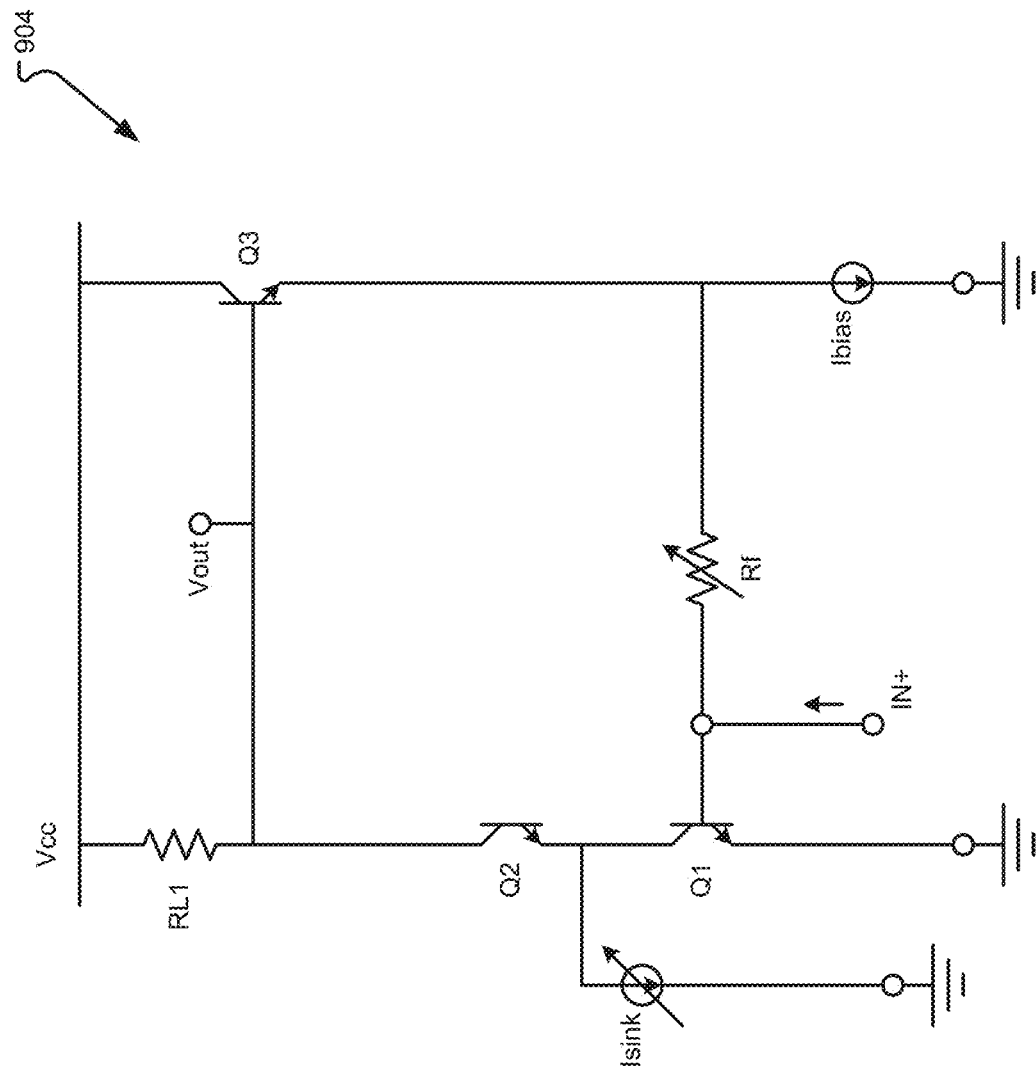
FIG. 9 is a circuit diagram depicting still another alternative variable gain amplifier circuit in accordance with at least some embodiments of the present disclosure.

The next circuit 904 depicted in FIG. 9 illustrates a solution where a sink branch is added and the current flowing through the sink branch Isink varies with the input optical power. At low input optical power, the value of the sink current Isink is effectively negligible, which effectively leaves the TIA transfer function unaffected. At high input optical power the value of the sink current Isink increases, which means that the TIA loop gain is reduced. The TIA loop gain is reduced because some current is stolen away from the transistor Q1, thereby reducing the peaking in the TIA's transfer function.

Figure 10:
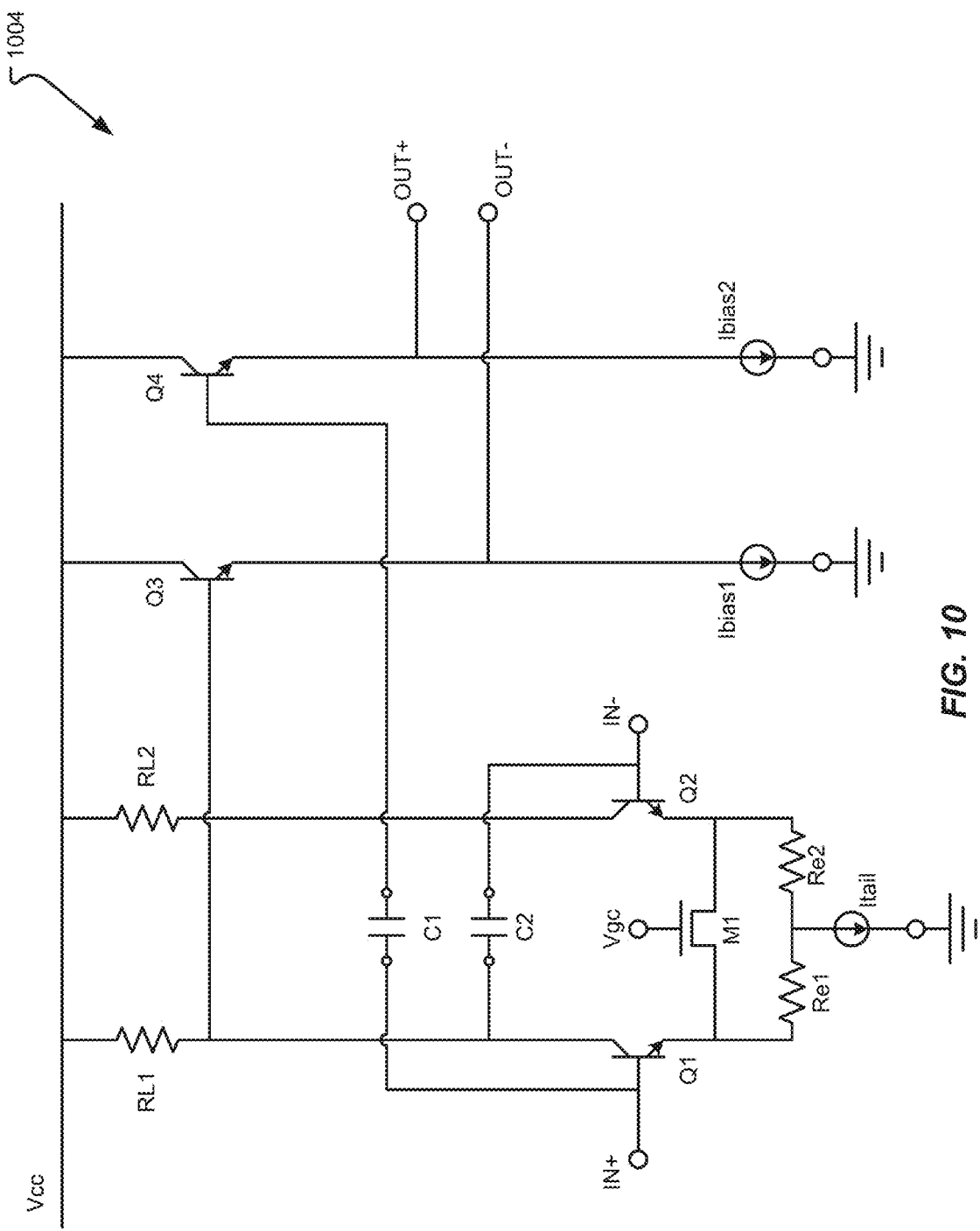
FIG. 10 is a circuit diagram depicting still another alternative variable gain amplifier circuit in accordance with at least some embodiments of the present disclosure.

FIG. 10 depicts still another circuit 1004 where negative miller capacitors C1, C2 are added across the differential pair of transistors Q1, Q2. The gain of the differential pair reduces as the input optical power increases. As there is an increase in the gain, the impact of the negative miller capacitors C1, C2 on the bandwidth is increased. Thus, at higher input optical power, the impact of the negative miller capacitors C1, C2 is reduced and the bandwidth is reduced, resulting in decreased peaking 604.

Specific details were given in the description to provide a thorough understanding of the embodiments. However, it will be understood by one of ordinary skill in the art that the embodiments may be practiced without these specific details. In other instances, well-known circuits, processes, algorithms, structures, and techniques may be shown without unnecessary detail in order to avoid obscuring the embodiments.

While illustrative embodiments of the disclosure have been described in detail herein, it is to be understood that the inventive concepts may be otherwise variously embodied and employed, and that the appended claims are intended to be construed to include such variations, except as limited by the prior art.

What is claimed is:

1. An amplifier, comprising:
a first transistor receiving a first portion of an input signal received at the amplifier;
a second transistor receiving a second portion of the input signal;
an automatic gain control signal that is dynamically adjustable in response to variations in an output of the amplifier; and
a varactor that has its capacitance adjusted by changes in the automatic gain control signal and, as a result, adjusts a position of a pole in a transfer function of the amplifier.

2. The amplifier of claim 1, further comprising:
a third transistor receiving a bias voltage as an input, an emitter of the third transistor being directly connected to a collector of the first transistor; and
a fourth transistor receiving the bias voltage as an input, an emitter of the fourth transistor being directly connected to a collector of the second transistor, wherein the varactor is connected to both a collector of the third transistor and a collector of the fourth transistor.

3. The amplifier of claim 2, wherein the automatic gain control signal comprises a control voltage from an automatic gain control loop.

4. The amplifier of claim 3, wherein an increase in the control voltage from the automatic gain control loop causes a capacitance of the varactor to decrease and wherein a decrease in the control voltage from the automatic gain control loop causes the capacitance of the varactor to increase.

5. The amplifier of claim 2, wherein the varactor comprises a first terminal directly connected to the collector of the third transistor and a second terminal directly connected to the collector of the fourth transistor.

6. The amplifier of claim 5, wherein the collector of the third transistor and the collector of the fourth transistor are connected to the control voltage from the automatic gain control loop via a first resistor and second resistor, respectively.

7. The amplifier of claim 5, further comprising:
a fifth transistor having its base directly connected to the collector of the third transistor and the first terminal of the varactor, wherein an emitter of the fifth transistor outputs an amplified version of the second portion of the input signal; and
a sixth transistor having its base directly connected to the collector of the fourth transistor and the second terminal of the varactor, wherein an emitter of the sixth transistor outputs an amplified version of the first portion of the input signal.

8. The amplifier of claim 1, further comprising:
a Metal-Oxide-Semiconductor Field-Effect Transistor (MOSFET) connected between an emitter of the first transistor and an emitter of the second transistor and having a gate that receives the automatic gain control signal.

9. A circuit, comprising:
a photodiode configured to receive an optical signal and convert the optical signal into an electrical signal; and
a variable gain amplifier configured to receive the electrical signal or a variant thereof and amplify the received electrical signal or the variant thereof, wherein the variable gain amplifier comprises:
a first transistor;
a second transistor;
an automatic gain control loop that generates a control voltage responsive to variations in an output of the variable gain amplifier; and
a varactor that has its capacitance adjusted by changes in the automatic gain control signal and, as a result, adjusts a position of a pole in a transfer function of the variable gain amplifier.

10. The circuit of claim 9, wherein the variable gain amplifier further comprises:
a third transistor receiving a bias voltage as an input, wherein an emitter of the third transistor is directly connected to a collector of the first transistor; and
a fourth transistor receiving the bias voltage as an input, wherein an emitter of the fourth transistor is directly connected to a collector of the second transistor, wherein the varactor is connected to both a collector of the third transistor and a collector of the fourth transistor.

11. The circuit of claim 10, wherein an increase in the control voltage from the automatic gain control loop causes a capacitance of the varactor to decrease and wherein a decrease in the control voltage from the automatic gain control loop causes the capacitance of the varactor to increase.

12. The circuit of claim 10, wherein the varactor comprises a first terminal directly connected to the collector of the third transistor and a second terminal directly connected to the collector of the fourth transistor.

13. The circuit of claim 12, wherein the collector of the third transistor and the collector of the fourth transistor are connected to the control voltage from the automatic gain control loop via a first resistor and second resistor, respectively.

14. The circuit of claim 13, wherein the variable gain amplifier further comprises:
   a fifth transistor having its base directly connected to the collector of the third transistor and the first terminal of the varactor, wherein an emitter of the fifth transistor outputs an amplified version of the second portion of the input signal; and
   a sixth transistor having its base directly connected to the collector of the fourth transistor and the second terminal of the varactor, wherein an emitter of the sixth transistor outputs an amplified version of the first portion of the input signal.

15. The circuit of claim 9, further comprising a second variable gain amplifier that receives the output from the variable gain amplifier and provides an amplified version thereof, wherein the second variable gain amplifier comprises a second varactor that has its capacitance adjusted by changes in the automatic gain control signal and, as a result, adjusts a position of a pole in a transfer function of the second variable gain amplifier.

16. An optical communication system, comprising:
   an analog front end comprising one or more variable gain amplifiers, the one or more variable gain amplifiers comprising:
      a first transistor;
      a second transistor;
      an automatic gain control loop that generates a control voltage responsive to variations in an output of the analog front end; and
      a varactor that has its capacitance adjusted by changes in the automatic gain control signal and, as a result, adjusts a position of a pole in a transfer function of the one or more variable gain amplifiers.

17. The optical communication system of claim 16, wherein the one or more variable gain amplifiers further comprises:
   a third transistor receiving a bias voltage as an input, wherein an emitter of the third transistor is directly connected to a collector of the first transistor; and
   a fourth transistor receiving the bias voltage as an input, wherein an emitter of the fourth transistor is directly connected to a collector of the second transistor, wherein the varactor is connected to both a collector of the third transistor and a collector of the fourth transistor.

18. The optical communication system of claim 17, wherein an increase in the control voltage from the automatic gain control loop causes a capacitance of the varactor to decrease and wherein a decrease in the control voltage from the automatic gain control loop causes the capacitance of the varactor to increase.

19. The optical communication system of claim 17, wherein the varactor comprises a first terminal directly connected to the collector of the third transistor and a second terminal directly connected to the collector of the fourth transistor.

20. The optical communication system of claim 17, wherein the variable gain amplifier further comprises:
   a fifth transistor having its base directly connected to the collector of the third transistor and the first terminal of the varactor, wherein an emitter of the fifth transistor outputs an amplified version of the second portion of the input signal; and
   a sixth transistor having its base directly connected to the collector of the fourth transistor and the second terminal of the varactor, wherein an emitter of the sixth transistor outputs an amplified version of the first portion of the input signal.

* * * * *